United States Patent
Kuang et al.

(10) Patent No.: US 9,281,372 B2
(45) Date of Patent: Mar. 8, 2016

(54) METAL GATE STRUCTURE AND MANUFACTURING METHOD THEREOF

(71) Applicant: TAIWAN SEMICONDUCTOR MANUFACTURING COMPANY LTD., Hsinchu (TW)

(72) Inventors: Shin-Jiun Kuang, Hsinchu (TW); Tsung-Hsing Yu, Taipei (TW); Yi-Ming Sheu, Hsinchu (TW); Chun-Yi Lee, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/334,004

(22) Filed: Jul. 17, 2014

(65) Prior Publication Data
US 2016/0020297 A1    Jan. 21, 2016

(51) Int. Cl.
*H01L 29/00* (2006.01)
*H01L 21/00* (2006.01)
*H01L 29/49* (2006.01)
*H01L 29/51* (2006.01)
*H01L 21/28* (2006.01)

(52) U.S. Cl.
CPC ........ *H01L 29/495* (2013.01); *H01L 21/28008* (2013.01); *H01L 29/51* (2013.01)

(58) Field of Classification Search
CPC . H01L 29/05; H01L 21/208; H01L 21/28008; H01L 21/823802; H01L 21/84; H01L 29/495; H01L 29/51; H01L 29/66545
See application file for complete search history.

(56) References Cited

U.S. PATENT DOCUMENTS

| 6,303,418 | B1 * | 10/2001 | Cha et al. ................ 438/199 |
| 7,915,111 | B2 * | 3/2011 | Yang et al. ................ 438/199 |
| 8,129,792 | B2 * | 3/2012 | Ichihara et al. ............. 257/369 |
| 8,193,641 | B2 * | 6/2012 | Rachmady ........ H01L 21/28088 257/758 |
| 8,536,040 | B1 * | 9/2013 | Park ............................ 438/592 |
| 8,551,874 | B2 * | 10/2013 | Seo et al. .................... 438/586 |

(Continued)

FOREIGN PATENT DOCUMENTS

| KR | 20070003991 | 1/2007 |
| KR | 20130126313 | 11/2013 |

OTHER PUBLICATIONS

Office Action of the corresponding Korean application 10-2014-0188340 from Korean Intellectual Property Office dated Dec. 28, 2015.

(Continued)

*Primary Examiner* — Nikolay Yushin
(74) *Attorney, Agent, or Firm* — WPAT, P.C.; Anthony King

(57) ABSTRACT

The present disclosure provides a semiconductor structure includes a gate structure disposed over a substrate, wherein the gate structure includes a high-k dielectric layer and a work function structure. The high-k dielectric layer includes a base portion and a side portion, the side portion is extended from an end of the base portion, the side portion is substantially orthogonal to the base portion. The work function structure includes a first metal disposed over the high-k dielectric layer and a second metal disposed over the first metal and including a bottom portion and a sidewall portion extended from an end of the bottom portion, wherein the first metal includes different materials from the second metal, and a length of an interface between the sidewall portion and the bottom portion to a length of the bottom portion within the high-k dielectric layer is in a predetermined ratio.

20 Claims, 14 Drawing Sheets

(56) References Cited

U.S. PATENT DOCUMENTS

| | | | |
|---|---|---|---|
| 2005/0224886 A1 | 10/2005 | Doyle et al. | |
| 2007/0262451 A1* | 11/2007 | Rachmady | H01L 21/28088 257/758 |
| 2009/0166749 A1* | 7/2009 | Ichihara et al. | 257/369 |
| 2010/0006955 A1 | 1/2010 | Takimoto | |
| 2011/0272765 A1* | 11/2011 | Seo et al. | 257/410 |
| 2011/0284966 A1* | 11/2011 | Wen et al. | 257/368 |
| 2012/0104509 A1 | 5/2012 | Matsumoto | |
| 2012/0146159 A1* | 6/2012 | Wang et al. | 257/410 |
| 2013/0037889 A1* | 2/2013 | Liao et al. | 257/411 |
| 2013/0277750 A1* | 10/2013 | Lai et al. | 257/369 |
| 2013/0299918 A1 | 11/2013 | Kim et al. | |

OTHER PUBLICATIONS

English translation of the Office Action of the corresponding Korean application 10-2014-0188340 from Korean Intellectual Property Office dated Dec. 28, 2015.
US20130299918 corresponds to KR20130126313.
US20050224886 corresponds to KR20070003991.

* cited by examiner

METAL GATE STRUCTURE AND MANUFACTURING METHOD THEREOF

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective capacitance as would be provided by a typical gate oxide used in larger technology nodes.

Polysilicon is used as a gate electrode in a semiconductor device such as metal oxide semiconductor (MOS). However, with a trend toward scaling down the size of the semiconductor device, the polysilicon gate has low performance such as reduction of gate capacitance and driving force of the semiconductor device. In some IC designs, there has been a desire to replace the typically polysilicon gate electrode with a metal gate (MG) electrode to improve device performance with the decreased feature sizes. One process of forming the MG electrode is termed "gate last" process, as opposed to another MG electrode formation process termed "gate first". The "gate last" process allows for reduced number of subsequent processes, including high temperature processing, that must be performed after formation of the gate.

There are many challenges on fabrication of the MG electrode in decreased feature size of the semiconductor device. Thus, there is a continuous need to enhance a metal gate structure, simplifying a manufacturing method of the metal gate on a substrate and improving a performance of the semiconductor device including the MG electrode.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1A:
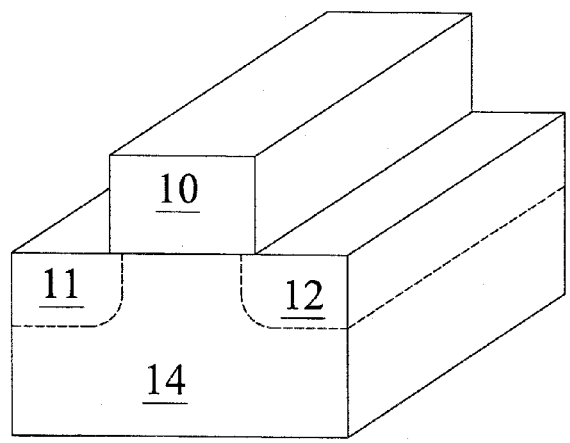
FIG. 1A is a right side perspective view of a transistor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
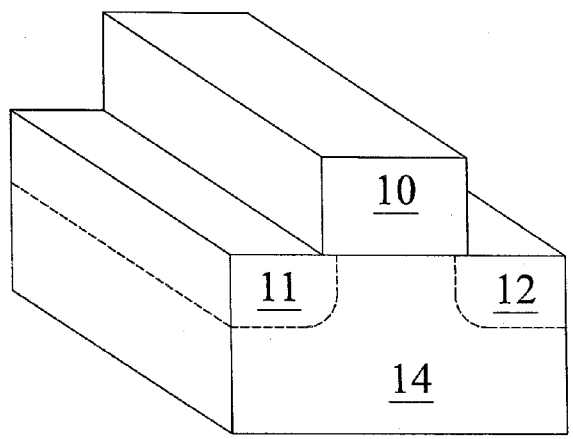
FIG. 1B is a left side perspective view of a transistor in accordance with some embodiments of the present disclosure.
Figure 1C:
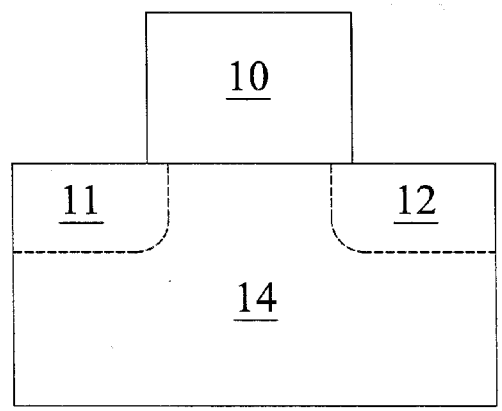
FIG. 1C is a front cross sectional view of a transistor in accordance with some embodiments of the present disclosure.

A semiconductor device includes a transistor. FIGS. 1A and 1B show right side and left side perspective views of an embodiment of a transistor respectively. FIG. 1C is a front view of the transistor of FIGS. 1A and 1B. The transistor includes a substrate 14 and a replacement metal gate 10 disposed over a surface of the substrate 14. The replacement metal gate 10 is fabricated between the source region 11 and the drain region 12.

Figure 2A:
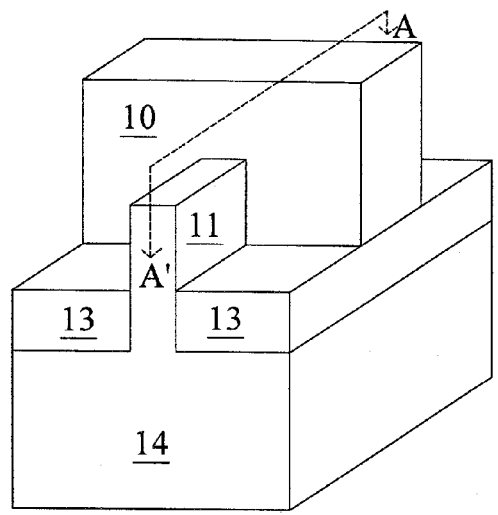
FIG. 2A is a front perspective view of a FinFET in accordance with some embodiments of the present disclosure.
Figure 2B:
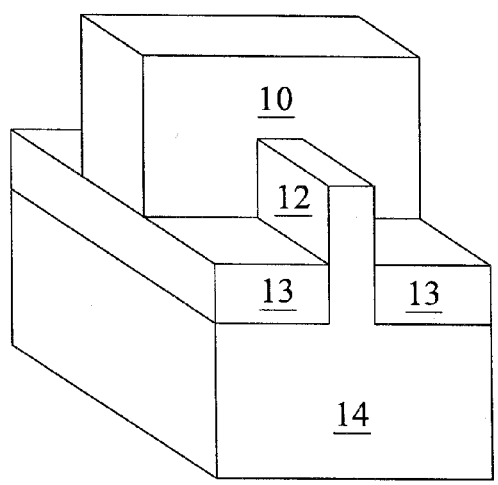
FIG. 2B is a rear perspective view of a FinFET in accordance with some embodiments of the present disclosure.
Figure 2C:
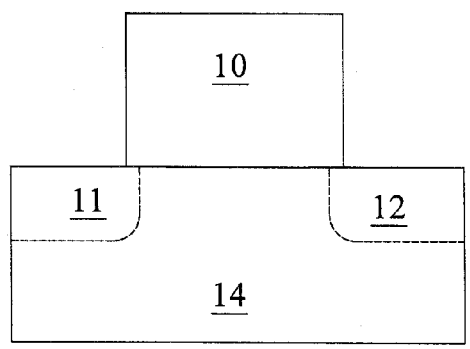
FIG. 2C is a cross sectional view of a FinFET of FIG. 2A along AA' in accordance with some embodiments of the present disclosure.

In another semiconductor device, a transistor is configured with several fins as a FinFET (Fin Field-Effect Transistor). FIGS. 2A and 2B show front and rear views of an embodiment of a FinFET. FIG. 2C is a cross sectional view of the FinFET of FIG. 2A along AA'. The FinFET includes a substrate 14, a dielectric layer 13 and a replacement metal gate 10. The substrate 14 includes a source region 11 and a drain region 12 extending upright respectively in fin configuration and are partially surrounded by the dielectric layer 13.

When a bias voltage greater than a threshold voltage ($V_{th}$) is applied on the replacement metal gate 10, some charge carriers are gathered in a sufficient concentration under the replacement metal gate 10 and thus a conduction channel is induced between the source region 11 and the drain region 12.

The threshold voltage of the metal gate electrode is typically tuned by doping ions such as aluminum into a work function metal layer of the metal gate electrode, so that the ions are diffused towards a dielectric layer of the metal gate electrode positioned closer to the conduction channel and thus lowered the threshold voltage. On the other hand, the threshold voltage of the metal gate electrode is adjusted by changing the work function of the metal gate electrode such as doping.

However, the ions implantation would cause high internal stress and implant damage to the metal gate electrode and result in a high leakage. Thus, a thermal annealing operation is required for the metal gate electrode after the ions implantation in order to reduce the implant damage. Such the thermal annealing would increase a manufacturing cost of the semiconductor device. Furthermore, the change of the work function by doping or other operations would result in a large variation of a drive current between the source and the drain regions due to uneven distribution of ions.

In the present disclosure, a semiconductor structure with a structural improvement on the replacement metal gate is disclosed. The semiconductor structure includes a metal layer which is adjusted in a predetermined dimension and shape in order to modulate a work function of the replacement metal gate as desired. The metal layer is formed in the predetermined dimension and shape by various photolithography and etching operations. The work function is tuned by controlling the photolithography and etching operations on the metal layer and thus forming the metal layer in the predetermined dimension and shape. As the work function is modulated by adjusting the dimension and shape of the metal layer instead of implanting ions into the metal layer, a performance of the semiconductor structure could be optimized without any implant damage or manufacturing cost increase.

Figure 3:
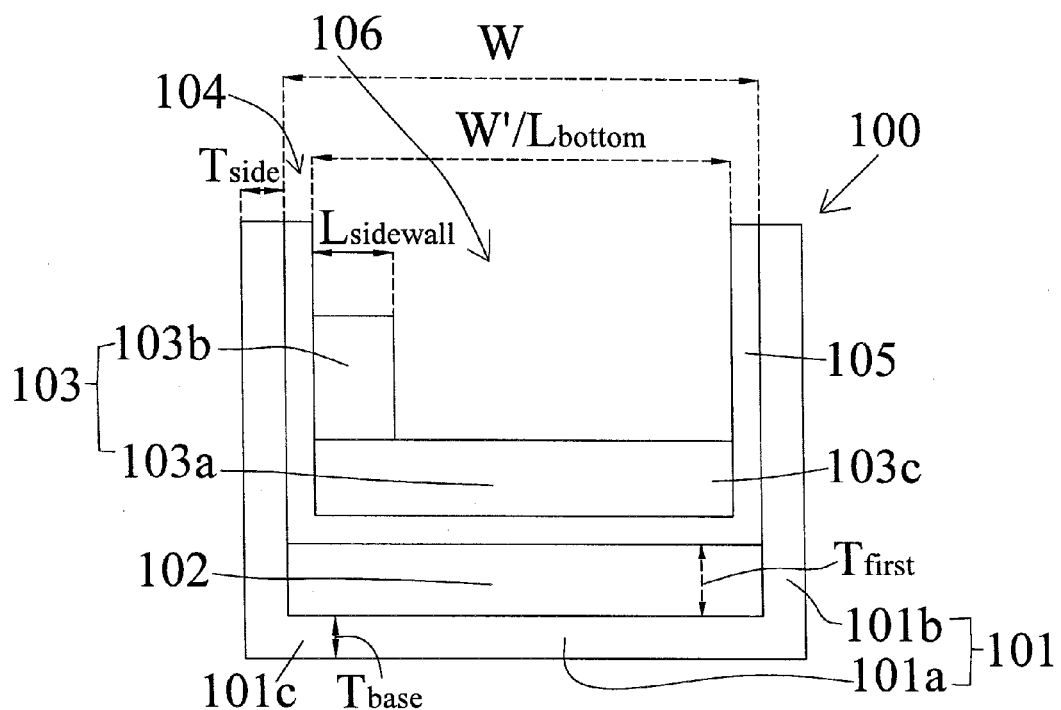
FIG. 3 is a schematic view of a semiconductor structure in accordance with some embodiments of the present disclosure.

FIG. 3 is a semiconductor structure 100 in accordance with various embodiments of the present disclosure. FIG. 3 is a cross sectional view of the semiconductor structure 100. In some embodiments, the semiconductor structure 100 includes a replacement metal gate. In some embodiments, the replacement metal gate is disposed over a substrate. In some embodiments, the replacement metal gate is disposed within a trench above the substrate, and the trench is defined by a removed sacrificial gate. In some embodiments, the replacement metal gate is surrounded by a spacer or a dielectric layer.

In some embodiments, the semiconductor structure 100 includes a high dielectric constant (high-k) dielectric layer 101 and a work function structure (102, 103). In some embodiments, the high-k dielectric layer 101 is a binary or ternary high-k film. In some embodiments, the high-k dielectric layer 101 is a deposited dielectric. In some embodiments, the high-k dielectric layer 101 includes metal oxide dielectric, titanium oxide ($TiO_2$), tantalum pentoxide ($Ta_2O_5$), tantalum oxide, hafnium oxide, zirconium oxide, aluminum oxide, lanthanum oxide, lanthanum aluminum oxide and silicates thereof, oxynitrides, other high k dielectrics such as PZT and BST or other suitable materials. In some embodiments, the high-k dielectric layer 101 has a thickness ranging from about 5 to about 30 Å.

In some embodiments, the high-k dielectric layer 101 includes a base portion 101a and a side portion 101b. In some embodiments, the base portion 101a is disposed and elongated horizontally. In some embodiments, the side portion 101b is extended from an end 101c of the base portion 101a and is substantially orthogonal to the base portion 101a. In some embodiments, the side portion 101b stands upright on the base portion 101a.

In some embodiments, the base portion 101a is elongated horizontally in an even thickness $T_{base}$, and the side portion 101b is elongated vertically from the base portion 101a in an even thickness $T_{side}$. In some embodiments, the side portion 101b and the base portion 101a have substantially same thicknesses. In some embodiments, the thickness $T_{side}$ of the high-k dielectric layer 101 is about 0.5 to 5 nm.

In some embodiments, the side portion 101b and the base portion 101a defines a cavity 104 for surrounding the work function structure (102, 103). In some embodiments, a width W of the cavity 104 is defined by the side portion 101b. In some embodiments, the width W between the side portion 101b is about 50 nm to about 500 nm. In some embodiments, a cross section of the cavity 104 is in a rectangular or quadrilateral shape.

In some embodiments, the work structure (102, 103) includes a first metal 102 and a second metal 103. In some embodiments, the first metal 102 is disposed over the high-k dielectric layer 101. In some embodiments, the first metal 102 is disposed on the base portion 101a of the high-k dielectric layer 101. In some embodiments, the first metal 102 is surrounded by the side portion 101b of the high-k dielectric layer 101 and is disposed within the cavity 104. In some embodiments, the first metal 102 is horizontally extended along the base portion 101a. In some embodiments, the first metal 102 has a thickness $T_{first}$ of about 0.1 nm to about 8 nm.

In some embodiments, the first metal 102 includes different materials from the second metal 103. In some embodiments, the first metal 102 is an N-type work function metal (N-metal). In some embodiments, the first metal 102 includes metal carbonitride, metal aluminide, metal silicon nitride, TiAl, TiAlN, WN, TaN, Ru or other suitable materials. In some embodiments, the first metal 102 includes a multi-metal layer structure such as TiAl/TiN.

In some embodiments, the second metal 103 is disposed over the first metal 102. In some embodiments, the second metal 103 is surrounded by the side portion 101b of the high-k dielectric layer 101. In some embodiments, the second metal 103 is disposed within an intermediate metallic layer 105. In some embodiments, the second metal 103 is disposed within a recess 106 defined by the intermediate metallic layer 105. In some embodiments, the second metal 103 is a P-type work function metal (P-metal). In some embodiments, the second metal 103 includes WN, TaN, Ru or other suitable materials. In some embodiments, the second metal 103 includes a multi-metal layer structure such as TiN/WN. In some embodiments, the second metal 103 is a stack of several layers of film.

In some embodiments, the second metal 103 includes a bottom portion 103a and a sidewall portion 103b. In some embodiments, the bottom portion 103a is disposed over the first metal 102. In some embodiments, the bottom portion 103a is disposed on the intermediate metallic layer 105. In some embodiments, the bottom portion 103a has a length $L_{bottom}$ of about 50 nm to about 500 nm. In some embodiments, the bottom portion 103a has the length $L_{bottom}$ which is substantially same as the width W' of the recess 106.

In some embodiments, the sidewall portion 103b is extended from an end 103c of the bottom portion 103a. In some embodiments, the sidewall portion 103b is vertically extended from the bottom portion 103a and is substantially orthogonal to the bottom portion 103a. In some embodiments, the sidewall portion 103b has a cross section in a rectangular or quadrilateral shape. In some embodiments, the sidewall portion 103b includes different materials from the bottom portion 103a.

In some embodiments, a length $L_{sidewall}$ of an interface between the sidewall portion 103b and the bottom portion 103a to a length $L_{bottom}$ of the bottom portion 103a within the high-k dielectric layer 101 is in a predetermined ratio. In some embodiments, the predetermined ratio of the length $L_{sidewall}$ to the length $L_{bottom}$ is about 1/5 to about 2/3. In some embodiments, the length $L_{sidewall}$ of the sidewall portion 103b is about 10 nm to about 280 nm.

Figure 3A:
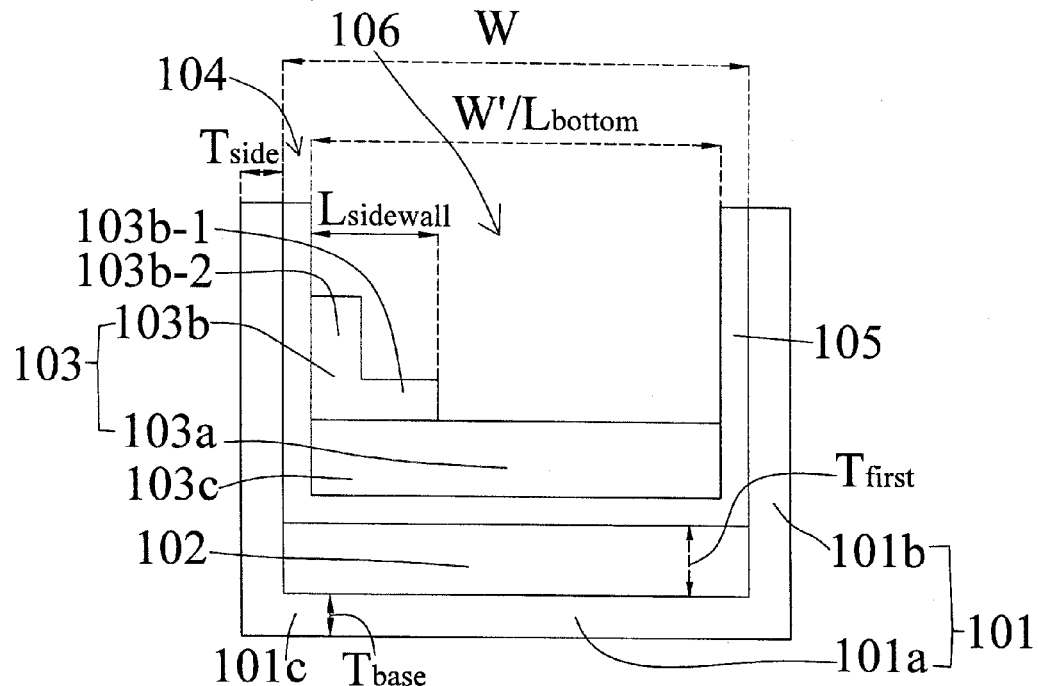
FIG. 3A is a schematic view of a semiconductor structure with a sidewall portion of a second metal in an L shape in accordance with some embodiments of the present disclosure.

The sidewall portion 103b is in various shapes. In some embodiments, the cross section of the sidewall portion 103b is in a polygonal shape. In some embodiments, the sidewall portion 103b has a cross section in a L shape as shown in FIG. 3A. In some embodiments, the sidewall portion 103b has a horizontal portion 103b-1 and a vertical portion 103b-2 extending orthogonal to the horizontal portion 103b-1.

In some embodiments as shown in FIG. 3A, the length $L_{sidewall}$ of an interface between the sidewall portion 103b and the bottom portion 103a to the length $L_{bottom}$ of the bottom portion 103a within the high-k dielectric layer 101 is in a predetermined ratio. In some embodiments, the predetermined ratio of the length $L_{sidewall}$ to the length $L_{bottom}$ is about 1/5 to about 2/3.

Figure 3B:
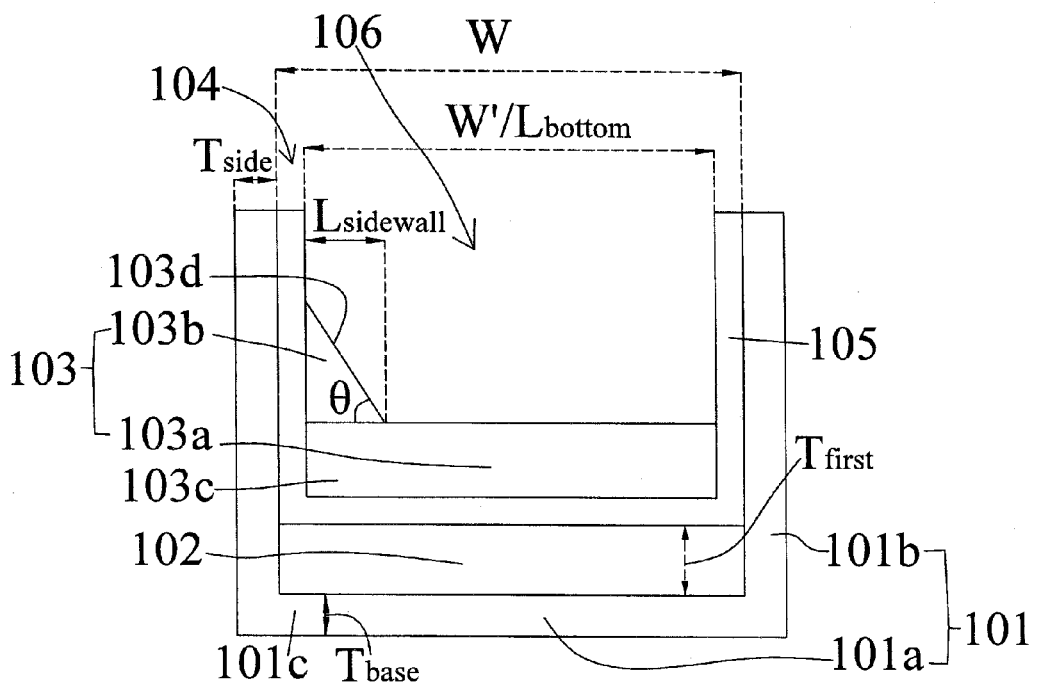
FIG. 3B is a schematic view of a semiconductor structure with a sidewall portion of a second metal in a triangular shape in accordance with some embodiments of the present disclosure.

In some embodiments, the sidewall portion 103b has a cross section in an triangular shape as shown in FIG. 3B. In some embodiments, the sidewall portion 103b includes an inclined surface 103d disposed between the bottom portion 103a of the second metal 103a and the side portion 101b of the high-k dielectric layer 101. In some embodiments, the inclined surface 103d is in an angle 8 of about 10° to about 85° from the bottom portion 103a.

In some embodiments as shown in FIG. 3B, the length $L_{sidewall}$ of an interface between the sidewall portion 103b and the bottom portion 103a to the length $L_{bottom}$ of the bottom portion 103a within the high-k dielectric layer 101 is in a predetermined ratio. In some embodiments, the predetermined ratio of the length $L_{sidewall}$ to the length $L_{bottom}$ is about 1/5 to about 2/3.

Figure 4:
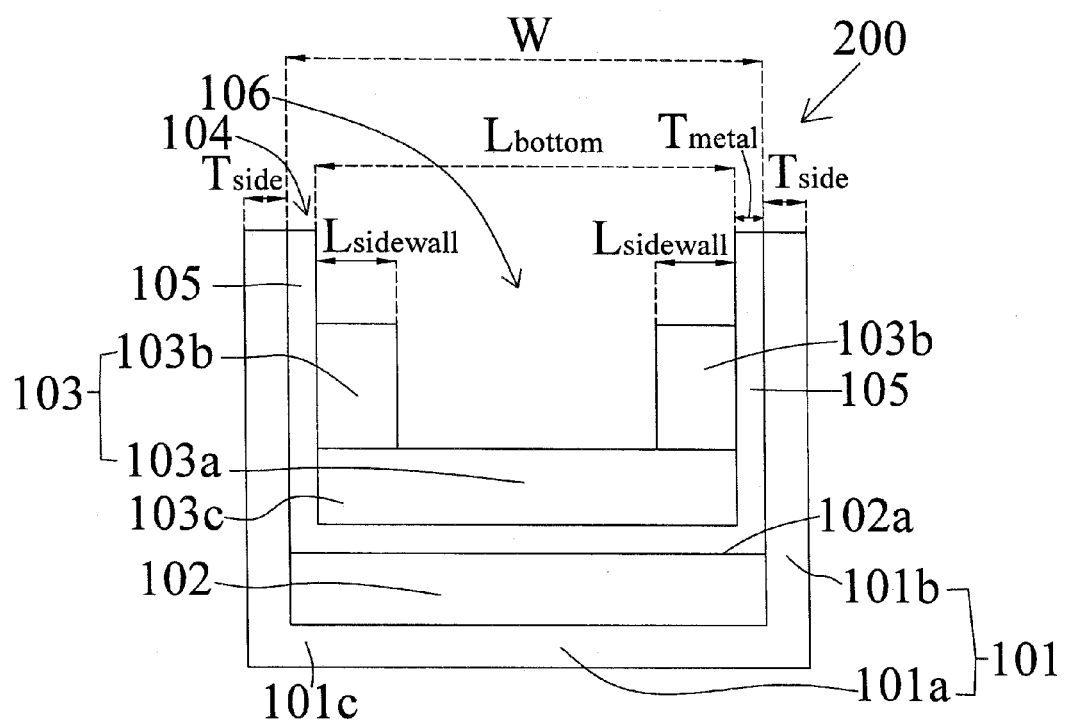
FIG. 4 is a schematic view of a semiconductor structure in accordance with some embodiments of the present disclosure.

FIG. 4 is a semiconductor structure 200 in accordance with various embodiments of the present disclosure. FIG. 4 is a cross sectional view of the semiconductor structure 200. In some embodiments, the semiconductor structure 200 includes a high-k dielectric layer 101 and a first metal 102 as configured in FIG. 3.

In some embodiments, the semiconductor structure 200 further includes an intermediate metallic layer 105 disposed over the first metal 102. In some embodiments, the intermediate metallic layer 105 is disposed within a cavity 104. In some embodiments, the intermediate metallic layer 105 is conformal to a top surface 102a of the first metal 102 and a side portion 101b of the high-k dielectric layer 101. In some embodiments, a recess 106 is defined by the intermediate metallic layer 105.

In some embodiments, the intermediate metallic layer 105 includes N-metal. In some embodiments, the intermediate metallic layer 105 includes materials different from the first metal 102. In some embodiments, the intermediate metallic layer 105 has a thickness $T_{metal}$ of about 5 to about 30 Å. In some embodiments, the thickness $T_{metal}$ is smaller than a thickness $T_{side}$ of the high-k dielectric layer 101.

In some embodiments, the semiconductor structure 200 includes a second metal 103. In some embodiments, the second metal 103 is disposed within the cavity 104 and the recess 106. In some embodiments, the intermediate metallic layer 105 is disposed between the first metal 101 and the second metal 103. The second metal 103 includes a bottom portion 103a and two sidewall portions 103b. In some embodiments, the sidewall portions 103b are extended from ends 103c of the bottom portion 103a along the side portion 101b of the high-k dielectric layer 101 respectively. In some embodiments, the second metal 103 is a P-metal.

In some embodiments, two sidewall portions 103b are in substantially same or different dimension, shape and materials. In some embodiments, cross sections of two sidewall portions 103b are in a rectangular or quadrilateral shape. Each of the sidewall portions 103b has a length $L_{sidewall}$ interfacing with the bottom portion 103c. In some embodiments, the lengths $L_{sidewall}$ are substantially same as each other. In some embodiments, total lengths $L_{sidewall}$ to a length $L_{bottom}$ of the bottom portion 103a within the high-k dielectric layer 101 is in a predetermined ratio. In some embodiments, the predetermined ratio of the total lengths $L_{sidewall}$ to the length $L_{bottom}$ is about 1/5 to about 2/3.

Figure 4A:
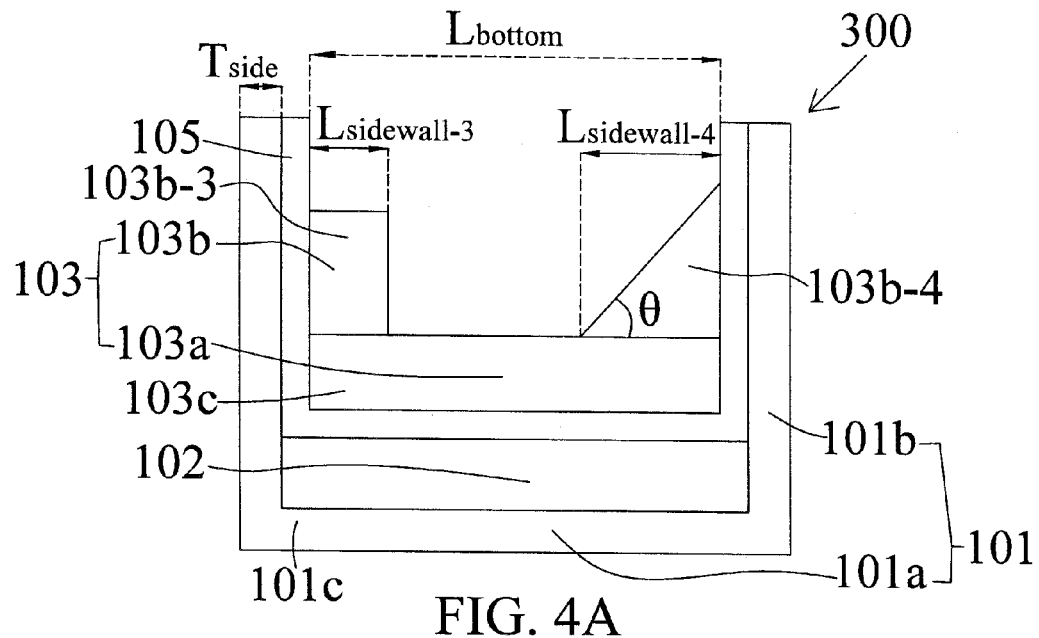
FIG. 4A is a schematic view of a semiconductor structure with a combination of shapes of sidewall portions of a second metal in accordance with some embodiments of the present disclosure.

In some embodiments, the sidewall portion 102b of the second metal 102 is a combination of sidewall portions 102b in various shapes or dimensions. FIG. 4A is a cross sectional view of a semiconductor structure 300 with the combination of sidewall portions 102b in different dimension and shape in accordance with various embodiments of the present disclosure.

In some embodiments, the semiconductor structure 300 includes a high-k dielectric layer 101 and a first metal 102 as configured in FIG. 3. In some embodiments, the second metal 103 of the semiconductor structure 300 includes a bottom portion 103a, a first sidewall portion 103b-3 and a second sidewall portion 103b-4.

In some embodiments, the first sidewall portion 103b-3 is in a rectangular shape and has similar configuration as the sidewall portion 103b in FIG. 3, and the second sidewall portion 103b-4 is in a triangular shape and has similar configuration as the sidewall portion 103b in FIG. 3B. In some embodiments, the first sidewall portion 103b-3 and the second sidewall portion 103b-4 are in substantially same or different materials.

The first sidewall portion 103b-3 and the second sidewall portion 103b-4 respectively have a length $L_{sidewall-3}$ and a length $L_{sidewall-4}$ interfacing with the bottom portion 103c. In some embodiments, the length $L_{sidewall-3}$ is substantially smaller than the length $L_{sidewall-4}$. In some embodiments, a total of the length $L_{sidewall-3}$ and the length $L_{sidewall-4}$ to a length $L_{bottom}$ of the bottom portion 103c is in a predetermined ratio. In some embodiments, the predetermined ratio of the total of the length $L_{sidewall-3}$ and the length $L_{sidewall-4}$ to the length $L_{bottom}$ is about 1/5 to about 2/3.

Figure 4B:
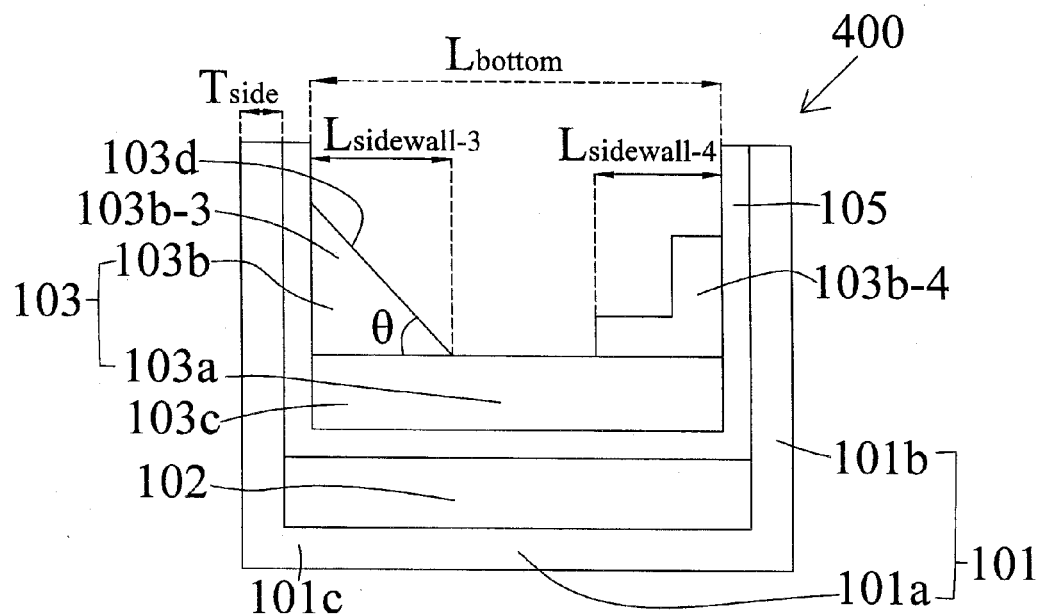
FIG. 4B is a schematic view of a semiconductor structure with another combination of shapes of sidewall portions of a second metal in accordance with some embodiments of the present disclosure.

FIG. 4B is a cross sectional view of a semiconductor structure 400 with a combination of sidewall portions 102b in different dimension and shape in accordance with various embodiments of the present disclosure. In some embodiments, the semiconductor structure 400 includes a high-k dielectric layer 101 and a first metal 102 as configured in FIG. 3. In some embodiments, the second metal 103 of the semiconductor structure 400 includes a bottom portion 103a, a first sidewall portion 103b-3 and a second sidewall portion 103b-4.

In some embodiments, the first sidewall portion 103b-3 is in a triangular shape and has similar configuration as the sidewall portion 103b in FIG. 3B, and the second sidewall portion 103b-4 is in a L shape and has similar configuration as the sidewall portion 103b in FIG. 3A. In some embodiments, the first sidewall portion 103b-3 and the second sidewall portion 103b-4 are in substantially same or different materials.

The first sidewall portion 103b-3 and the second sidewall portion 103b-4 respectively have a length $L_{sidewall-3}$ and a length $L_{sidewall-4}$ interfacing with the bottom portion 103c. In some embodiments, a total of a length $L_{sidewall-3}$ and a length $L_{sidewall-4}$ to a length $L_{bottom}$ of the bottom portion 103c is in a predetermined ratio of about 1/5 to about 2/3.

Figure 5:
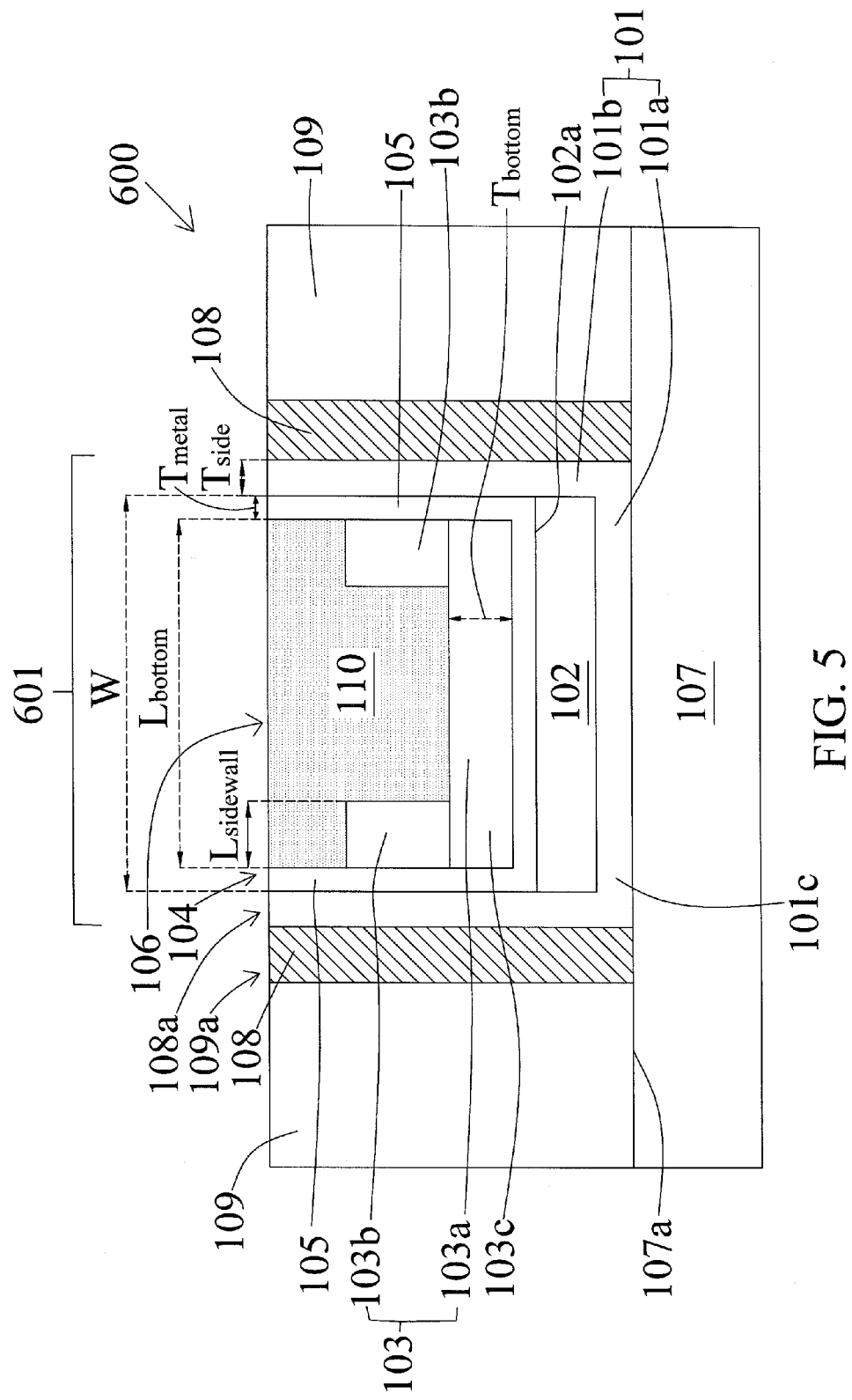
FIG. 5 is a schematic view of a semiconductor structure in accordance with some embodiments of the present disclosure.

FIG. 5 is a cross sectional view of a semiconductor structure 600 in accordance with various embodiments of the present disclosure. In some embodiments, the semiconductor structure 600 includes a substrate 107, an interlayer dielectric layer (ILD) 109, a spacer 108 and a replacement metal gate 601. In some embodiments, the semiconductor structure 600 is a unit transistor in a semiconductor device. In some embodiments, the semiconductor structure 600 is configured to be various types of transistor such as NMOS, PMOS, etc. depending on majority of carriers induced in the substrate 107. The substrate 107 may also include some doped regions adjacent to the replacement metal gate 601 and the doped regions can be contacts such as source and drain.

In some embodiments, the substrate 107 is disposed underneath the replacement metal gate and is doped to act as a buried channel for carrier induction during operation of the unit transistor. In some embodiments, various devices such as transistors, resistors, and/or capacitors are formed on the substrate 107 and are interconnected through interconnect layers to additional integrated circuits.

In some embodiments, the substrate 107 is a bulk semiconductor substrate, silicon on insulator (SOI) substrate or etc. In some embodiments, the substrate 100 includes an elementary semiconductor, such as silicon or germanium in a crystalline structure; a compound semiconductor such as silicon germanium, silicon carbide, gallium arsenic, gallium phosphide, indium phosphide, indium arsenide, and/or indium antimonide; or combinations thereof.

In some embodiments, the ILD 109 is disposed over the substrate 107. In some embodiments, the ILD 109 is disposed on a surface 107a of the substrate 107. In some embodiments, the ILD 109 defines a first cavity 109a for surrounding the replacement metal gate positioned over the substrate 107. The replacement metal gate is disposed within the first cavity 109a.

In some embodiments, the ILD 109 includes one or more dielectric materials and/or one or more dielectric layers. In some embodiments, the dielectric material includes silicon oxide, silicon nitride, silicon oxynitride, spin-on glass (SOG), fluorinated silica glass (FSG), carbon doped silicon oxide (e.g., SiCOH), BLACK DIAMOND® (Applied Materials of Santa Clara, Calif.), XEROGEL®, AEROGEL®, amorphous fluorinated carbon, Parylene, BCB (bis-benzocyclobutenes), FLARE®, SILK® (Dow Chemical, Midland, Mich.), polyimide, other proper porous polymeric materials, other suitable dielectric materials, and/or combinations thereof. In some embodiments, the ILD 109 includes a high density plasma (HDP) dielectric material (e.g., HDP oxide) and/or a high aspect ratio process (HARP) dielectric material (e.g., HARP oxide).

In some embodiments, the spacer 108 is disposed over the substrate 107 and is surrounded by the ILD 109. In some embodiments, the spacer 108 is disposed on the surface 107a of the substrate 107. In some embodiments, the spacer 108 defines a second cavity 108a for surrounding the replacement metal gate positioned over the substrate 107. The replacement metal gate is disposed within the second cavity 108a.

In some embodiments, the spacer 108 is a single layer or multilayer structure. In some embodiments, the spacer 108 includes a dielectric material such as silicon nitride, silicon carbide, silicon oxynitride, other suitable materials, and/or combinations thereof.

In some embodiments, the replacement metal gate is disposed over the substrate 107 and within the first cavity 109a and the second cavity 108a. In some embodiments, the replacement metal gate is in a similar configuration as the semiconductor structure 100 of FIG. 3 or the semiconductor structure 200 of FIG. 4.

In some embodiments, the replacement metal gate includes the high-k dielectric layer 101 surrounded by the spacer 108 and the ILD 109. In some embodiments, the high-k dielectric layer 101 surrounds a first metallic structure including the first metal 102 disposed over the high-k dielectric layer 101 and the intermediate metallic layer 105 surrounding a second metallic structure. In some embodiments, the first metallic structure is disposed within a third cavity 104 defined by the high-k dielectric layer 101. In some embodiments, the second metallic structure is disposed within a recess 106 defined by the intermediate metallic layer 105.

In some embodiments, the second metallic structure includes the second metal 103. The second metal 103 includes a bottom portion 103a horizontally disposed on and within the intermediate metallic layer 105 and a sidewall portion 103b extended from an end 103c of the bottom portion 103a. In some embodiments, the bottom portion 103a is configured as the bottom portion 103a in FIG. 3 or 4. In some embodiments, the sidewall portion 103b is configured as the sidewall portion 103b in FIG. 3, 3A, 3B, 4, 4A or 4B.

In some embodiments, dimensions and shapes of the bottom portion 103a and the sidewall portion 103b are defined in accordance with a desired threshold voltage of the semiconductor structure 600. In some embodiments, the bottom portion 103a has a predetermined length $L_{bottom}$ and thickness $T_{bottom}$. In some embodiments, the thickness $T_{bottom}$ of the bottom portion 103a is about 0.1 nm to about 8 nm. In some embodiments, the sidewall portion 103b has a predetermined length $L_{sidewall}$ interfacing with the bottom portion 103a or a predetermined rectangular shape.

In some embodiments, the predetermined length $L_{bottom}$, thickness $T_{bottom}$ or length $L_{sidewall}$ is/are adjusted in order to have the desired threshold voltage or the work function of the semiconductor structure 600. In some embodiments, the desired threshold voltage is in a range greater than about 100 mV. In some embodiments, an ion variation of the second metallic structure in the predetermined dimension and shape is less than about 3%.

In some embodiments, the sidewall portion 103b is in a tapered configuration as shown in FIG. 3B. Referring back to FIG. 5, the sidewall portion 103b is in various shapes such as rectangular, quadrilateral, triangular or polygonal, depending on the desired threshold voltage or the work function of the semiconductor structure 600. In some embodiments, the length $L_{sidewall}$ to the length $L_{bottom}$ is in a predetermined ratio in order to arrive the desired threshold voltage or the work function of the semiconductor structure 600. In some embodiments, the ratio is about 1/5 to about 2/3.

In some embodiments, a gate fill metal 110 is disposed within the recess 106 defined by the intermediate metallic layer 105 and the second metallic structure (103a, 103b). In some embodiments, the gate fill metal 110 includes metals having a stand alone work function. In some embodiments, the gate fill metal 110 includes aluminum, tungsten, or cobalt and the alloys thereof.

In the present disclosure, a method of manufacturing a semiconductor structure is also disclosed. In some embodiments, a semiconductor structure is formed by a method 700. The method 700 includes a number of operations and the description and illustration are not deemed as a limitation as the sequence of the operations.

Figure 6:
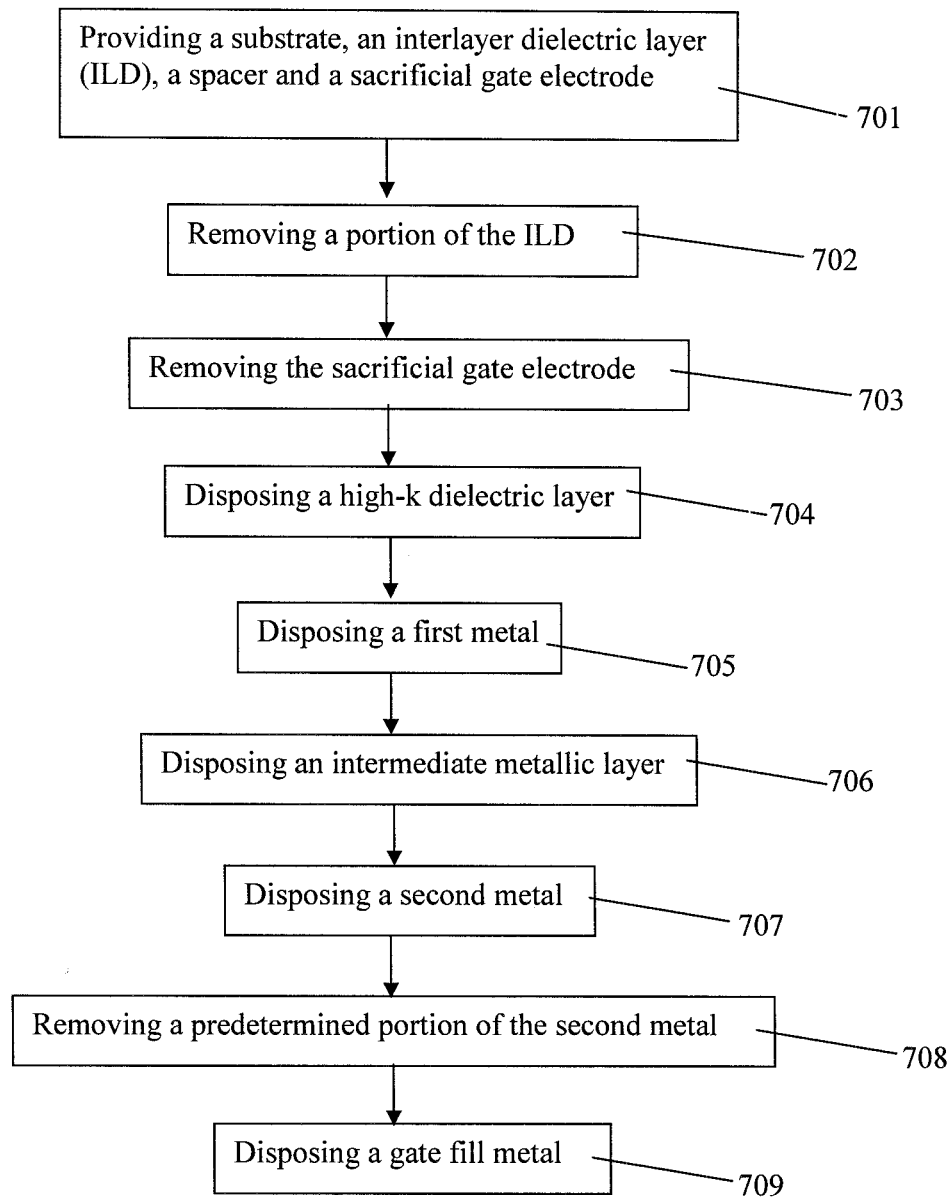
FIG. 6 is a flow diagram of a method of manufacturing a semiconductor structure in accordance with some embodiments of the present disclosure.

FIG. 6 is a diagram of a method 700 of manufacturing a semiconductor device in accordance with various embodiments of the present disclosure. The method 700 includes a number of operations (701, 702, 703, 704, 705, 706, 707, 708 and 709).

Figure 6A:
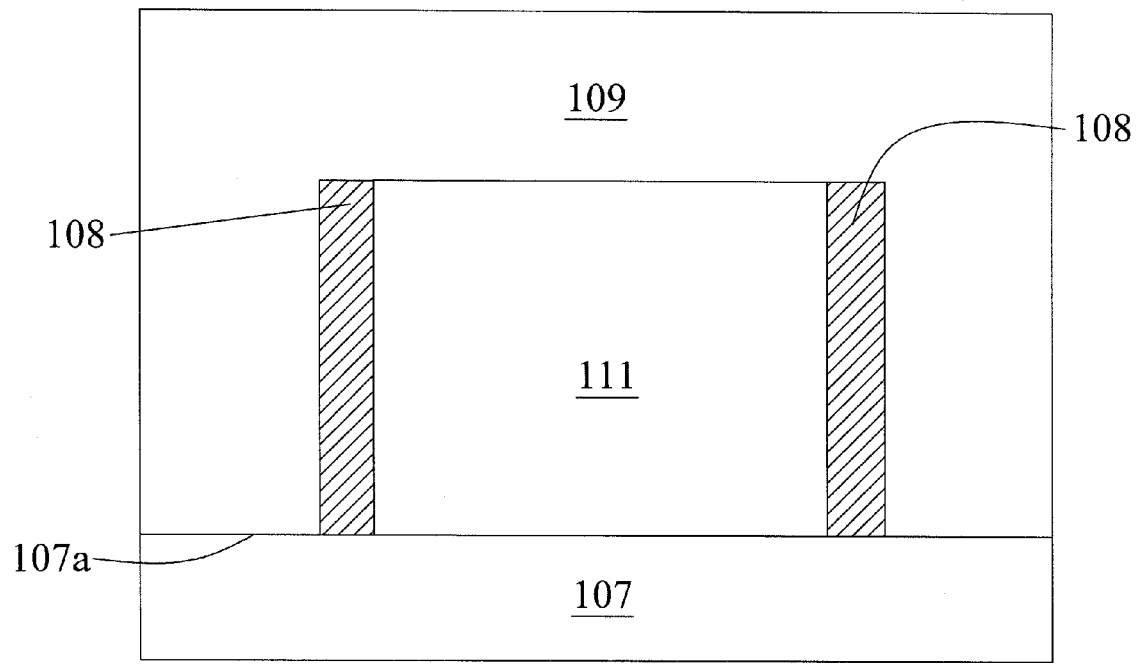
FIG. 6A is a schematic view of a semiconductor structure with an interlayer dielectric layer covering a spacer and a sacrificial gate electrode in accordance with some embodiments of the present disclosure.

In operation 701, a substrate 107, an interlayer dielectric layer (ILD) 109, a spacer 108 and a sacrificial gate electrode 111 are provided as in FIG. 6A. In some embodiments, the substrate 107, the ILD 109 and the spacer 108 have similar configuration as in FIG. 5. In some embodiments, the sacrificial gate electrode 111 is surrounded by the spacer 108 and the ILD 109. In some embodiments, the spacer 108 and the sacrificial gate electrode 111 are encapsulated by the ILD 109. The ILD 109, the spacer 108 and the sacrificial gate electrode 111 are formed on the substrate 107 according to the current art.

In some embodiments, the spacer 108 between the sacrificial gate electrode 111 and the ILD 109 is formed by blanket depositing a conformal dielectric film covering a top surface and a sidewall of the sacrificial gate electrode 111. In some embodiments, the spacer 108 is a silicon nitride film formed by a hot wall, low pressure chemical vapor deposition (LPCVD) operation. Next, the spacer 108 is anisotropically etched by, for example, plasma etching or reactive ion etching (RIE). The anisotropic etch of the spacer 108 removes the dielectric film from horizontal surfaces, such as the top surface of the sacrificial gate electrode 111 as well as the surface 107a of the substrate 107. In some embodiments, the RIE etch is continued for sufficient period of time to remove the spacer 108 from all horizontal surfaces.

Figure 6B:
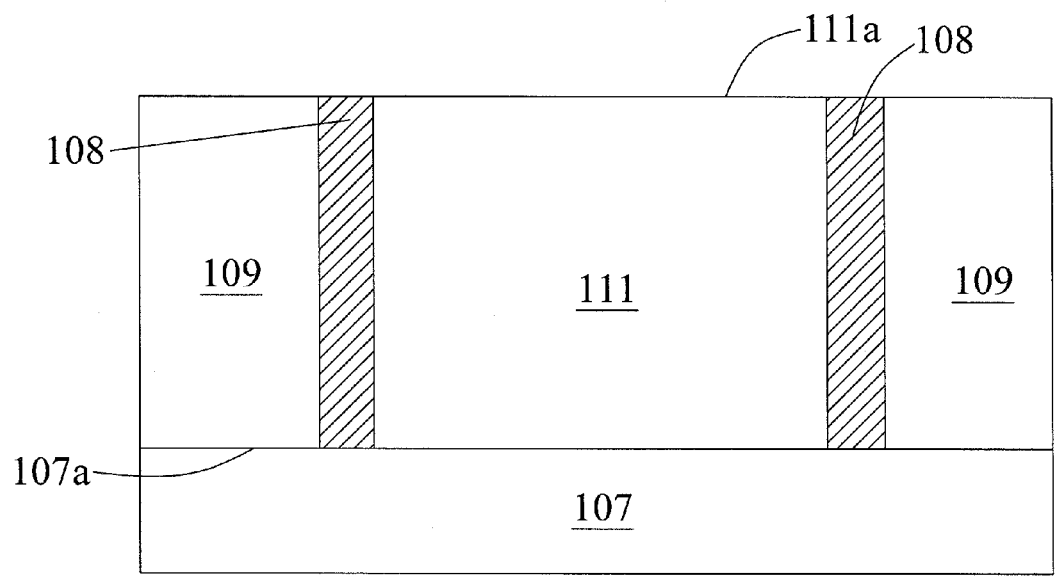
FIG. 6B is a schematic view of a semiconductor structure with a planarized interlayer dielectric layer, a spacer and a sacrificial gate electrode in accordance with some embodiments of the present disclosure.

In operation 702, a portion of the ILD 109 is removed as in FIG. 6B. In some embodiments, a top portion of the ILD 109 is removed such that a top surface 111a of the sacrificial gate electrode 111 is exposed. In some embodiments, a planarization operation such as a chemical mechanical polishing (CMP) operation is performed to remove the top portion of the ILD 109. In some embodiments, the CMP operation includes a high selectivity to provide a substantially planar top surface for the ILD 109, the spacer 108 and the sacrificial gate electrode 111. In some embodiments, the CMP process has low dishing and/or metal erosion effect. The planarization operation is carried out to remove the excess ILD 109 over the top surface 111a of the sacrificial gate electrode 111 until the sacrificial gate electrode 111 is exposed from the ILD 109.

Figure 6C:
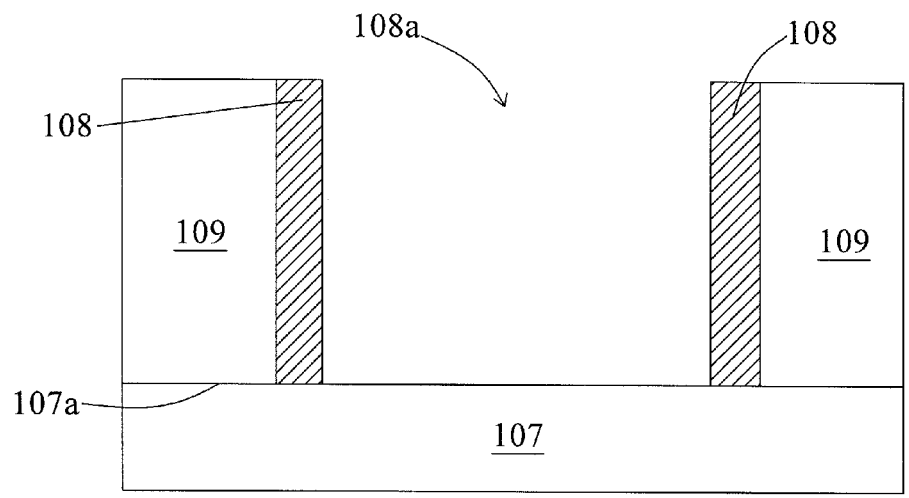
FIG. 6C is a schematic view of a semiconductor structure with a cavity in accordance with some embodiments of the present disclosure.

In operation 703, the sacrificial gate electrode 111 is removed as in FIG. 6C. In some embodiments, the sacrificial gate electrode 111 is removed and thus a cavity 108a is formed. In some embodiments, the sacrificial gate electrode 111 is formed of polysilicon. The polysilicon sacrificial gate electrode 111 is removed utilizing a wet etchant comprising water and tetramethylammonium hydroxide in between 10-35% of the solution by volume. The tetramethylammonium hydroxide solution is heated to a temperature between 60-95 degrees Celsius during the etching.

In some embodiments, sonic energy such as, ultrasonic or megasonic energy, is applied during the etch process. Sonic energy provides agitation to the etchant which enables etch residue to be removed from altered sacrificial gate electrode 111 and allows new etchant to enter into trench to etch the sacrificial gate electrode 111.

Figure 6D:
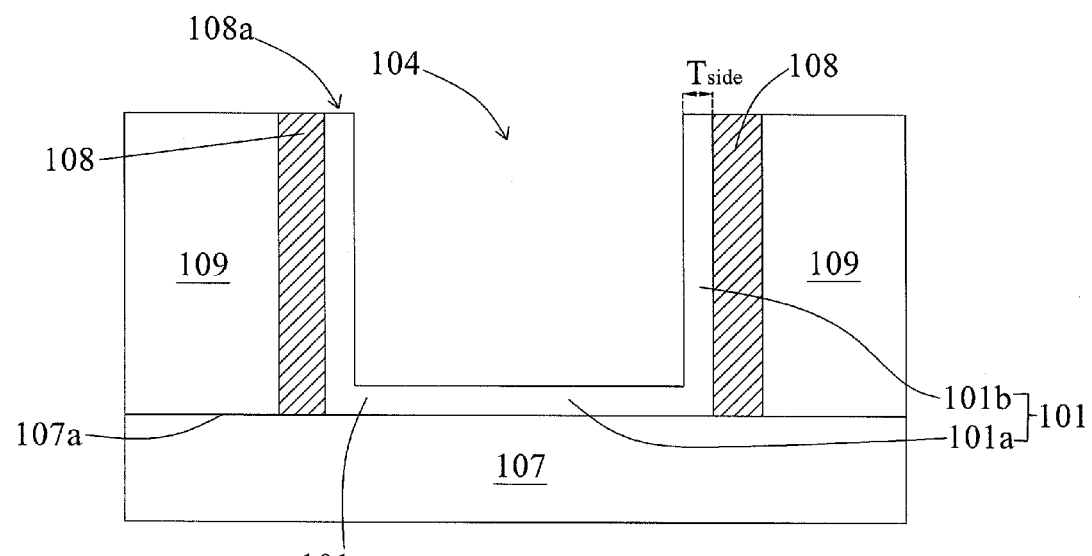
FIG. 6D is a schematic view of a semiconductor structure with a high-k dielectric layer in accordance with some embodiments of the present disclosure.

In operation 704, a high-k dielectric layer 101 is disposed conformal to a sidewall of the cavity 108a and the top surface of the ILD 109 and the spacer 108 as in FIG. 6D. In some embodiments, the high-k dielectric layer 101 includes a high dielectric constant film formed by any well known technique, such as but not limited to chemical vapor deposition (CVD) or atomic layer deposition (ALD).

In some embodiments, the high-k dielectric layer 101 including a base portion 101a and a side portion 101b is formed. In some embodiments, the base portion 101a is disposed over the substrate 107, and the side portion 101b is extended from an end 101c of the base portion 101a and substantially orthogonal to the base portion 101a. In some embodiments, the high-k dielectric layer 101 is grown to a thickness $T_{side}$ of about 0.5 nm to about 5 nm. In some embodiments, the high-k dielectric layer 101 has similar configuration as in FIGS. 3-5.

Figure 6E:
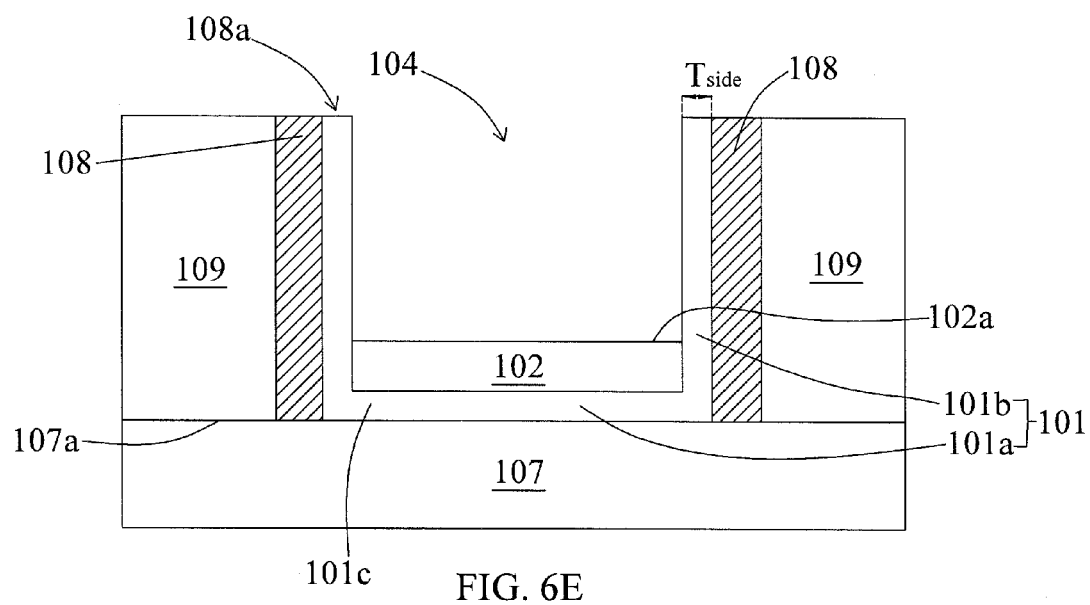
FIG. 6E is a schematic view of a semiconductor structure with a first metal in accordance with some embodiments of the present disclosure.

In operation 705, a first metal 102 is disposed over the high-k dielectric layer 101 as in FIG. 6E. In some embodiments, the first metal 102 is disposed within the cavity 108a and is surrounded by the high-k dielectric layer 101. In some embodiments, the first metal 102 is an N-metal and has similar configuration as in FIG. 3-5. In some embodiments, the first metal 102 is formed by ALD, PVD, CVD, or other suitable process.

Figure 6F:
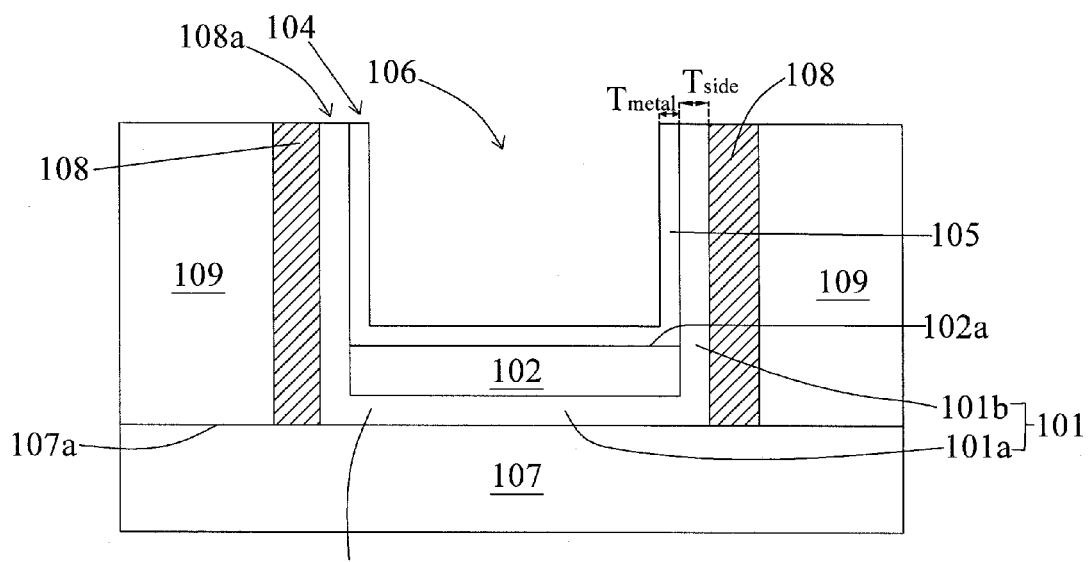
FIG. 6F is a schematic view of a semiconductor structure with an intermediate metallic layer in accordance with some embodiments of the present disclosure.

In operation 706, an intermediate metallic layer 105 is disposed on the first metal 102 as in FIG. 6F. In some embodiments, the intermediate metallic layer 105 is formed on the first metal 102 and is conformal to a top surface 102a of the first metal 102 and the side portion 101b of the high-k dielectric layer 101. In some embodiments, the intermediate metallic layer 105 is formed by ALD, PVD, CVD, or other suitable process.

Figure 6G:
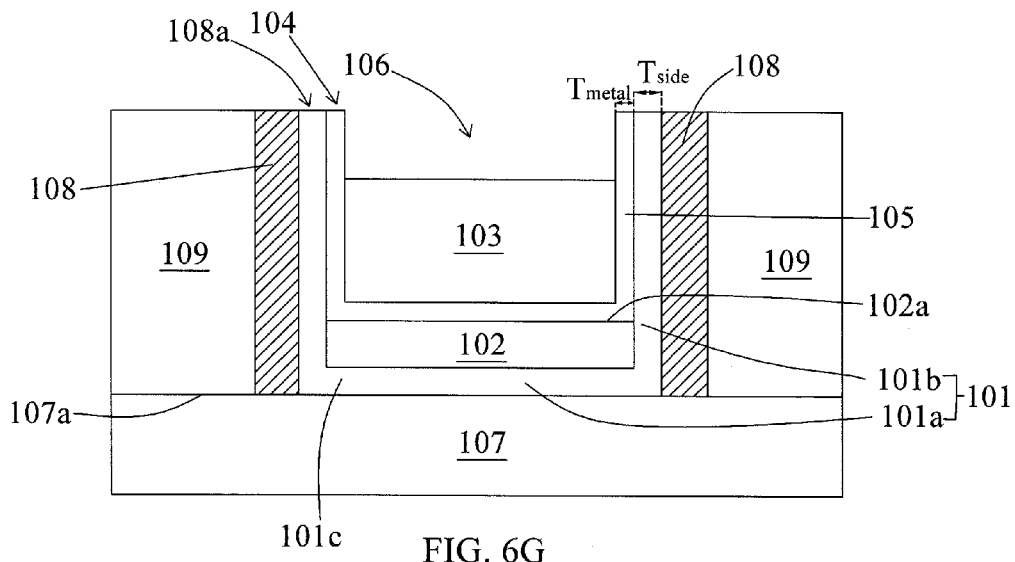
FIG. 6G is a schematic view of a semiconductor structure with a second metal in accordance with some embodiments of the present disclosure.

In operation 707, a second metal 103 is disposed over the first metal 102 as in FIG. 6G. In some embodiments, the second metal 103 is surrounded by the high-k dielectric layer 101 or the intermediate metallic layer 105. In some embodiments, the second metal 103 is disposed within the recess 106. In some embodiments, the second metal 103 includes different materials from the first metal 102. In some embodiments, the second metal 103 is a P-metal. In some embodiments, the second metal 103 is formed by ALD, PVD, CVD, or other suitable process.

Figure 6H:
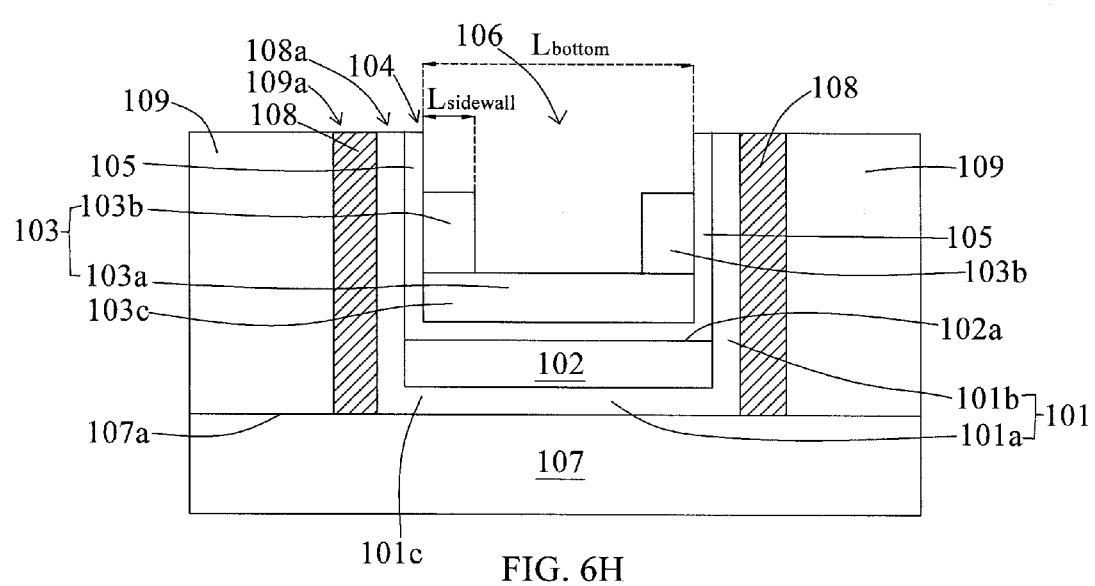
FIG. 6H is a schematic view of a semiconductor structure with a second metal in a predetermined dimension and shape in accordance with some embodiments of the present disclosure.

In operation 708, a predetermined portion of the second metal 103 is removed to form a bottom portion 103a and a sidewall portion 103b as in FIG. 6H. In some embodiments, the sidewall portion 103b is extended from an end 103c of the bottom portion 103a. In some embodiments, the predetermined portion of the second metal 103 is removed by photolithography operations and etching operations. In some embodiments, the photolithography operations and etching operations are performed repeatedly and alternatively until arriving a predetermined dimension and shape of the second metal 103.

Figure 6I:
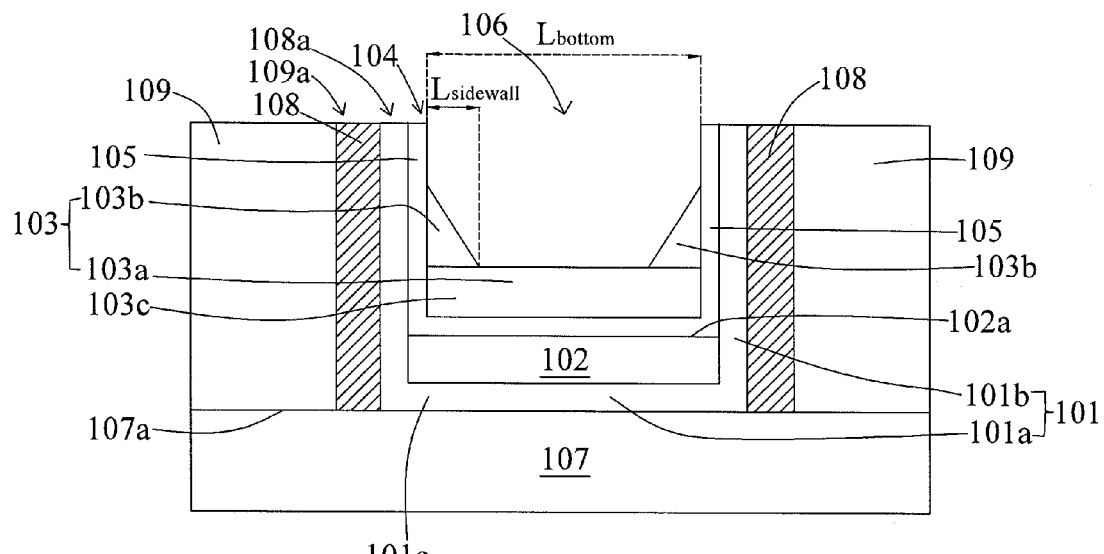
FIG. 6I is a schematic view of a semiconductor structure with a sidewall portion of a second metal in a triangular shape in accordance with some embodiments of the present disclosure.
Figure 6J:
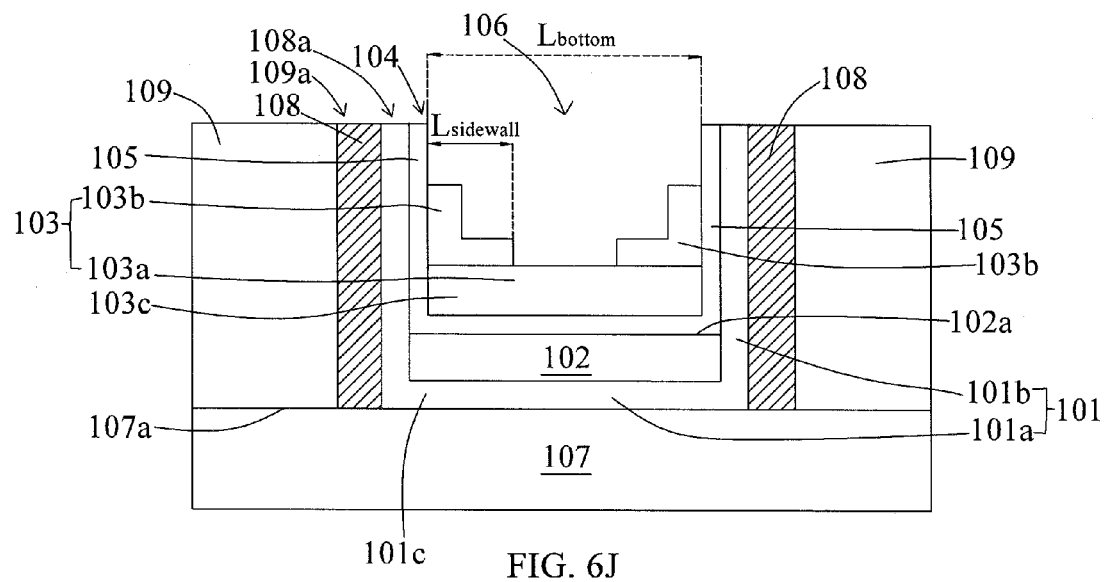
FIG. 6J is a schematic view of a semiconductor structure with a sidewall portion of a second metal in an L shape in accordance with some embodiments of the present disclosure.

In some embodiments, the bottom portion 103a and the sidewall portion 103b are formed in predetermined dimensions and shapes in accordance with a desired threshold voltage of the semiconductor structure. In some embodiments, the predetermined portion of the second metal 103 is removed, so that the sidewall portion 103b in predetermined shape is formed to arrive the desired threshold voltage or a desired work function of the second metal 103. In some embodiments, the sidewall portion 103b can be in various shapes such as rectangular shape as in FIGS. 3 and 6H, triangular shape in FIGS. 3B and 6I or L shape in FIGS. 3A and 6J, depending on the desired threshold voltage. In some embodiments, the desired threshold voltage of the semiconductor structure is in a range greater than about 100 mV.

In some embodiments, the predetermined portion of the second metal 103 is removed, so that the sidewall portion 103b in predetermined dimension is formed to arrive the desired threshold voltage or a desired work function of the second metal 103. In some embodiments, a length $L_{sidewall}$ of an interface between the sidewall portion 103b and the bottom portion 103a to a length $L_{bottom}$ of the bottom portion 103a is in a predetermined ratio after removing the predetermined portion of the second metal 103. The threshold voltage of the semiconductor structure is modulated by removing the predetermined portion and thus the length $L_{sidewall}$ to the length $L_{bottom}$ is in the predetermined ratio. In some embodiments, the threshold voltage of the semiconductor structure is in a range greater than about 100 mV.

Figure 6K:
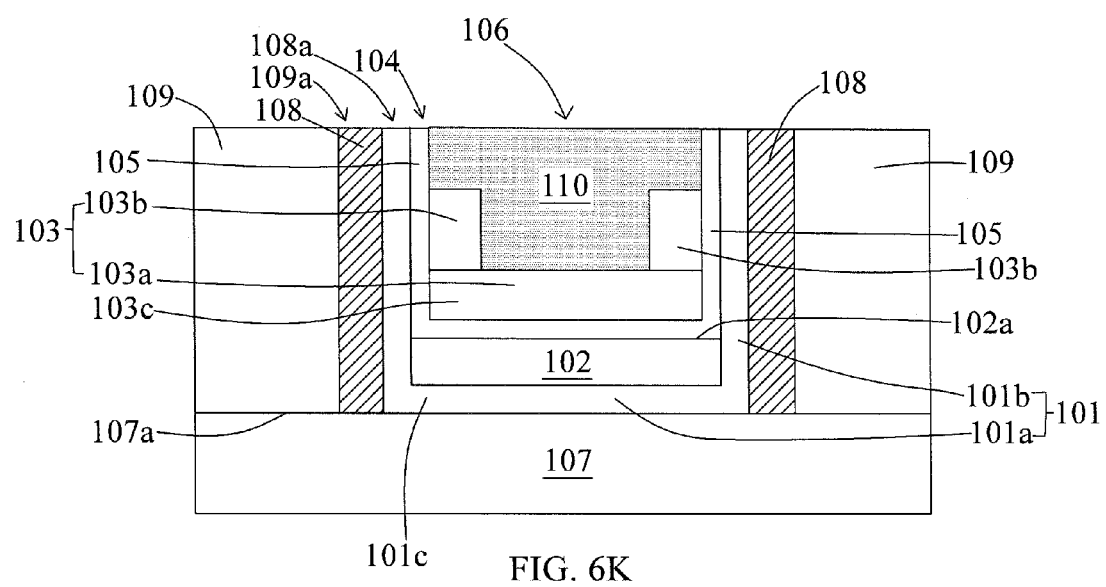
FIG. 6K is a schematic view of a semiconductor structure with a gate fill metal in accordance with some embodiments of the present disclosure.

In operation 709, a gate fill metal 110 is disposed within the recess 106 defined by the intermediate metallic layer 105 and the second metal 103 as in FIG. 6K. In some embodiments, the gate fill metal 110 is formed by any suitable methods.

In the present disclosure, a threshold voltage or a work function of a semiconductor structure is tuned by adjusting a metal layer in a predetermined dimension and shape. The metal layer is formed in the predetermined dimension and shape in accordance with the threshold voltage or the work function as desired. The metal layer is formed in the predetermined dimension and shape by removing a predetermined portion of the metal layer through photolithography and etching operations. As the threshold voltage or work function is modulated by adjusting the dimension and shape of the metal layer instead of implanting ions into the metal layer, no implant damage would be caused on the semiconductor structure and thus a performance of the semiconductor structure could be optimized.

In some embodiments, a semiconductor structure includes a gate structure disposed over a substrate, the gate structure includes a high-k dielectric layer including a base portion and a side portion, wherein the side portion is extended from an end of the base portion, the side portion is substantially orthogonal to the base portion, and a work function structure comprising a first metal disposed over the high-k dielectric layer, and a second metal disposed over the first metal and including a bottom portion and a sidewall portion extended from an end of the bottom portion, wherein the first metal includes different materials from the second metal, and a length of an interface between the sidewall portion and the bottom portion to a length of the bottom portion within the high-k dielectric layer is in a predetermined ratio.

In some embodiments, the predetermined ratio is about 1/5 to about 2/3. In some embodiments, the length of the bottom portion is about 50 nm to about 500 nm. In some embodiments, the bottom portion and the sidewall portion are in different materials. In some embodiments, the first metal is an N-type work function metal or the second metal is a P-type work function metal. In some embodiments, a cross section of the sidewall portion is in a triangular, rectangular, quadrilateral, polygonal or L shape.

In some embodiments, the sidewall portion further includes an inclined surface in an angle of about 10° to about 85° from the bottom portion. In some embodiments, the bottom portion is in a rectangular shape and the sidewall portion is in a triangular or L shape. In some embodiments, the semiconductor structure further comprising an intermediate metallic layer disposed between the first metal and the second metal and conformal to a top surface of the first metal and a side portion of the high-k dielectric layer.

In some embodiments, a semiconductor structure includes a high-k dielectric layer, a first metallic structure surrounded by the high-k dielectric layer, and a second metallic structure surrounded by the intermediate metallic layer, wherein the first metallic structure includes a first metal disposed over the high-k dielectric layer and an intermediate metallic layer surrounding the second metallic structure, and the second metallic structure includes a bottom portion horizontally disposed on the intermediate metallic layer and a sidewall portion extended from an end of the bottom portion, and dimensions and shapes of the bottom portion and the sidewall portion are defined in accordance with a desired threshold voltage of the semiconductor structure In some embodiments, the desired threshold voltage is in a range greater than about 100 mV. In some embodiments, a thickness of the bottom portion is about 0.1 nm to about 8 nm. In some embodiments, an ion variation of the second metallic structure is less than about 3%. In some embodiments, the sidewall portion is in a tapered configuration.
the high-k dielectric layer is surrounded by a spacer.

In some embodiments, a method of manufacturing a semiconductor structure includes forming a high-k dielectric layer including a base portion and a side portion, wherein the side portion is extended from an end of the base portion, the side portion is substantially orthogonal to the base portion, disposing a first metal over the high-k dielectric layer, disposing a second metal over the first metal, and removing a predetermined portion of the second metal to form a bottom portion and a sidewall portion of the second metal extended from an end of the bottom portion of the second metal, wherein the first metal includes different materials from the second metal, and a length of an interface between the sidewall portion and the bottom portion to a length of the bottom portion is in a predetermined ratio.

In some embodiments, the removing the predetermined portion of the second metal includes photolithography operations and etching operations. In some embodiments, the removing the predetermined portion of the second metal includes modulating a threshold voltage of the semiconductor structure to a range greater than 100 mV.

In some embodiments, the removing the predetermined portion of the second metal includes forming the bottom portion and the sidewall portion in predetermined dimensions and shapes in accordance with a desired threshold voltage of the semiconductor structure. In some embodiments, the method further includes disposing an intermediate metallic layer on the first metal and conformal to a top surface of the first metal and a side portion of the high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a gate structure disposed over a substrate, wherein the gate structure comprises:
      a high-k dielectric layer including a base portion and a side portion, wherein the side portion is extended from an end of the base portion, the side portion is substantially orthogonal to the base portion; and
      a work function structure comprising:
         a first metal disposed over and along the base portion of the high-k dielectric layer; and
         a second metal disposed over the first metal and including a bottom portion and a sidewall portion extended from an end of the bottom portion, wherein an end of the first metal is protruded from the second metal towards the side portion of the high-k dielectric layer, and wherein the first metal includes different materials from the second metal, and a length of an interface between the sidewall portion and the bottom portion to a length of the bottom portion within the high-k dielectric layer is in a predetermined ratio, and the first metal is a work function metal of a first type and the second metal is a work function metal of a second type, and the first type is opposite to the second type.

2. The semiconductor structure in claim 1, wherein the predetermined ratio is about 1/5 to about 2/3.

3. The semiconductor structure in claim 1, wherein the length of the bottom portion is about 50 nm to about 500 nm.

4. The semiconductor structure in claim 1, wherein the bottom portion and the sidewall portion are in different materials.

5. The semiconductor structure in claim 1, wherein the first metal is an N-type work function metal or the second metal is a P-type work function metal.

6. The semiconductor structure in claim 1, wherein a cross section of the sidewall portion is in a triangular, rectangular, quadrilateral, polygonal or L shape.

7. The semiconductor structure in claim 1, wherein the sidewall portion further includes an inclined surface in an angle of about 10° to about 85° from the bottom portion.

8. The semiconductor structure in claim 1, wherein the bottom portion is in a rectangular shape and the sidewall portion is in a triangular or L shape.

9. The semiconductor structure in claim 1, further comprising an intermediate metallic layer disposed between the first metal and the second metal and conformal to a top surface of the first metal and a side portion of the high-k dielectric layer.

10. A semiconductor structure, comprising:
    a high-k dielectric layer including a base portion and a side portion;
    a first metallic structure surrounded by the high-k dielectric layer,
    wherein the first metallic structure comprises:
       a first metal disposed over the base portion of the high-k dielectric layer; and
       an intermediate metallic layer disposed over the first metal and interfaced with the side portion of the high-k dielectric layer; and
    a second metallic structure surrounded by the intermediate metallic layer,
    wherein the second metallic structure comprises:
       a bottom portion horizontally disposed on the intermediate metallic layer; and
       a sidewall portion extended from an end of the bottom portion,
    wherein dimensions and shapes of the bottom portion and the sidewall portion are defined in accordance with a desired threshold voltage of the semiconductor structure, and the first metal is a work function metal of a first type and the second metallic structure is a work function metal of a second type, and the first type is opposite to the second type.

11. The semiconductor structure in claim 10, wherein the desired threshold voltage is in a range greater than about 100 mV.

12. The semiconductor structure in claim 10, wherein a thickness of the bottom portion is about 0.1 nm to about 8 nm.

13. The semiconductor structure in claim 10, wherein an ion variation of the second metallic structure is less than about 3%.

14. The semiconductor structure in claim 10, wherein the sidewall portion is in a tapered configuration.

15. The semiconductor structure in claim 10, the high-k dielectric layer is surrounded by a spacer.

16. A method of manufacturing a semiconductor structure, comprising:
    forming a high-k dielectric layer over a substrate, wherein the high-k dielectric layer includes a base portion and a side portion, the side portion is extended from an end of the base portion, the side portion is substantially orthogonal to the base portion;
    disposing a first metal over the high-k dielectric layer;
    disposing a second metal over the first metal; and removing a predetermined portion of the second metal to form a bottom portion and a sidewall portion of the second metal extended from an end of the bottom portion of the second metal, wherein the first metal includes different materials from the second metal, and a length of an interface between the sidewall portion and the bottom portion to a length of the bottom portion is in a predetermined ratio, and the removing the predetermined portion of the second metal includes forming the bottom portion and the sidewall portion in predetermined dimensions and shapes in accordance with a desired threshold voltage of the semiconductor structure.

17. The method of claim 16, wherein the removing the predetermined portion of the second metal includes photolithography operations and etching operations.

18. The method of claim 16, wherein the removing the predetermined portion of the second metal includes modulating a threshold voltage of the semiconductor structure to a range greater than 100 mV.

19. The method of claim 16, wherein the removing the predetermined portion of the second metal includes forming the sidewall portion extended along the side portion of the high-k dielectric layer.

20. The method of claim 16, further comprising disposing an intermediate metallic layer on the first metal and conformal to a top surface of the first metal and a side portion of the high-k dielectric layer.

* * * * *